United States Patent
Wang et al.

(10) Patent No.: US 10,778,357 B2
(45) Date of Patent: Sep. 15, 2020

(54) WORD ALIGNMENT USING DESERIALIZER PATTERN DETECTION

(71) Applicant: Samsung Display Co., Ltd., Yongin-si, Gyeonggi-do (KR)

(72) Inventors: Michael Wang, San Jose, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/275,193

(22) Filed: Feb. 13, 2019

(65) Prior Publication Data

US 2020/0136736 A1 Apr. 30, 2020

Related U.S. Application Data

(60) Provisional application No. 62/753,859, filed on Oct. 31, 2018.

(51) Int. Cl.
H04J 3/06 (2006.01)

(52) U.S. Cl.
CPC ..................................... H04J 3/06 (2013.01)

(58) Field of Classification Search
CPC ... H03K 19/17744; H03M 9/00; H04J 3/0685
See application file for complete search history.

(56) References Cited

U.S. PATENT DOCUMENTS

| | | |
|---|---|---|
| 6,594,275 B1 | 7/2003 | Schneider |
| 7,994,950 B1 | 8/2011 | Lo et al. |
| 10,230,552 B1* | 3/2019 | Graumann ........ H04L 25/03057 |
| 2003/0115542 A1 | 6/2003 | Hwang et al. |
| 2005/0069071 A1 | 3/2005 | Kim et al. |
| 2008/0169946 A1 | 7/2008 | Shin et al. |
| 2008/0175310 A1 | 7/2008 | Okamura et al. |
| 2011/0170560 A1 | 7/2011 | Kyles et al. |
| 2011/0194659 A1 | 8/2011 | Kenney |
| 2013/0107987 A1 | 5/2013 | Park et al. |
| 2016/0323093 A1 | 11/2016 | Hashimoto |

OTHER PUBLICATIONS

Kareem Ismail, et al. "Design and Implementation of CDR and SerDes for High-Speed Optical Communication Networks using FPGA", InTransparent Optical Networks (ICTON), IEEE, 18th International Conference, Jul. 10, 2016, pp. 1-4.

EPO Extended Search Report dated Mar. 24, 2020, for corresponding European Patent Application No. 19199040.7 (9 pages).

* cited by examiner

*Primary Examiner* — Chandrahas B Patel
(74) *Attorney, Agent, or Firm* — Lewis Roca Rothgerber Christie LLP

(57) ABSTRACT

A system for word alignment. In some embodiments, the system includes a deserializer circuit, an alignment detection circuit, and a clock generator circuit. The clock generator circuit has a plurality of enable outputs connected to a plurality of enable inputs of the deserializer circuit, and a plurality of clock outputs connected to a plurality of clock inputs of the deserializer circuit. The alignment detection circuit is configured to detect a coarse word alignment; and, in response to detecting the coarse word alignment, to cause a reset of the clock generator circuit.

20 Claims, 10 Drawing Sheets

Four possibilities for the parallel output ambiguity due to decimation

| 305 | 405 | 410 | 415 |
|-----|-----|-----|-----|
| 0 | 0 | 0 | 1 |
| 0 | 0 | 1 | 1 |
| 1 | 1 | 1 | 1 |
| 1 | 1 | 1 | 1 |
| 1 | 1 | 1 | 1 |
| 1 | 1 | 1 | 0 |
| 1 | 1 | 0 | 0 |
| 0 | 1 | 0 | 0 |
| 0 | 0 | 0 | 0 |
| 0 | 0 | 0 | 0 |

Signature: 000  001  011  111

*FIG. 4*

WORD ALIGNMENT USING DESERIALIZER PATTERN DETECTION

CROSS-REFERENCE TO RELATED APPLICATION(S)

The present application claims priority to and the benefit of U.S. Provisional Application No. 62/753,859, filed Oct. 31, 2018, entitled "WORD ALIGNMENT USING DESERIALIZER PATTERN DETECTION", the entire content of which is incorporated herein by reference.

FIELD

One or more aspects of embodiments according to the present disclosure relate to serial to parallel conversion, and more particularly to a system and method for word alignment using deserializer pattern detection.

BACKGROUND

A deserializer circuit may be used in various applications, e.g., to convert a serial data stream to a parallel data stream. When the serial data stream originates from a remote transmitter and the deserializer circuit is part of a receiver, a reset signal for the entire system may not be available, and it may be advantageous to infer word boundaries in the received data stream from the data stream itself. Such a process may be referred to as word alignment.

Thus, there is a need for a system and method for word alignment.

SUMMARY

According to some embodiments of the present disclosure, there is provided a system for word alignment, the system including: a deserializer circuit; an alignment detection circuit; and a clock generator circuit, the clock generator circuit having: a plurality of enable outputs connected to a plurality of enable inputs of the deserializer circuit, and a plurality of clock outputs connected to a plurality of clock inputs of the deserializer circuit; the alignment detection circuit being configured: to detect a coarse word alignment; and in response to detecting the coarse word alignment, to cause a reset of the clock generator circuit.

In some embodiments, the deserializer circuit includes a plurality of stages, each stage including: one or more demultiplexers, and a plurality of flip-flops, each having a data input connected to a respective output of one of the one or more demultiplexers.

In some embodiments: a data output of a first flip-flop of a first stage of the plurality of stages is connected to an input of the alignment detection circuit; the alignment detection circuit is configured to detect the coarse word alignment from a change in value at the data output of the first flip-flop; and the first stage is not the last stage of the deserializer circuit.

In some embodiments, the alignment detection circuit is further configured, in response to detecting the coarse word alignment, to capture a fine alignment code.

In some embodiments, the system further includes a fine alignment circuit configured to adjust word alignment in increments of one bit position.

In some embodiments, the fine alignment circuit includes: a plurality of shift blocks having delays differing by one bit position; and a demultiplexer configured to select a data stream from one of the shift blocks.

In some embodiments: the alignment detection circuit is further configured, in response to detecting the coarse word alignment, to capture a fine alignment code; and the demultiplexer of the fine alignment circuit is configured to select a data stream from one of the shift blocks based on the fine alignment code.

In some embodiments: the deserializer circuit includes a plurality of stages, each stage including: one or more demultiplexers, and a plurality of flip-flops, each having a data input connected to a respective output of one of the one or more demultiplexers; a data output of a first flip-flop of a first stage of the plurality of stages is connected to an input of the alignment detection circuit; the alignment detection circuit is configured to detect the coarse word alignment from a change in value at the data output of the first flip-flop; and the first stage is not the last stage of the deserializer circuit.

In some embodiments, the alignment detection circuit is further configured, in response to detecting the coarse word alignment, to capture a fine alignment code.

In some embodiments, the fine alignment code includes output signals from all of the flip-flops of the first stage except the first flip-flop.

According to some embodiments of the present disclosure, there is provided a method for word alignment in a system including: a deserializer circuit, and a clock generator circuit, the method including: deserializing a received data stream, by the deserializer circuit; detecting a coarse word alignment in the received data stream; and in response to detecting the coarse word alignment, resetting the clock generator circuit.

In some embodiments, the deserializer circuit includes a plurality of stages, each stage including: one or more demultiplexers, and a plurality of flip-flops, each having a data input connected to a respective output of one of the one or more demultiplexers.

In some embodiments: the detecting of the coarse word alignment includes detecting a change in value at a data output of a first flip-flop of a first stage of the plurality of stages; and the first stage is not the last stage of the deserializer circuit.

In some embodiments, the method further includes, in response to detecting the coarse word alignment, capturing a fine alignment code.

In some embodiments, the method further includes adjusting word alignment by one bit position.

In some embodiments, the system further includes a plurality of shift blocks having delays differing by one bit position.

In some embodiments, the method further includes: in response to detecting the coarse word alignment, capturing a fine alignment code; and selecting a data stream from one of the shift blocks based on the fine alignment code.

In some embodiments: the deserializer circuit includes a plurality of stages, each stage including: one or more demultiplexers, and a plurality of flip-flops, each having a data input connected to a respective output of one of the one or more demultiplexers; the detecting of the coarse word alignment includes detecting a change in value at a data output of a first flip-flop of a first stage of the plurality of stages; and the first stage is not the last stage of the deserializer circuit.

In some embodiments, the fine alignment code includes output signals from all of the flip-flops of the first stage except the first flip-flop.

According to some embodiments of the present disclosure, there is provided a system for word alignment, the system including: a deserializer circuit; a clock generator circuit; and means for: detecting a coarse word alignment; and in response to detecting the coarse word alignment, resetting the clock generator circuit.

BRIEF DESCRIPTION OF THE DRAWINGS

These and other features and advantages of the present disclosure will be appreciated and understood with reference to the specification, claims, and appended drawings wherein:

FIG. 2A is a data reordering diagram, according to an embodiment of the present disclosure;

FIG. 2B is a data reordering diagram, according to an embodiment of the present disclosure;

FIG. 4 is a data reordering diagram, according to an embodiment of the present disclosure;

DETAILED DESCRIPTION

The detailed description set forth below in connection with the appended drawings is intended as a description of exemplary embodiments of a system and method for word alignment using deserializer pattern detection provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
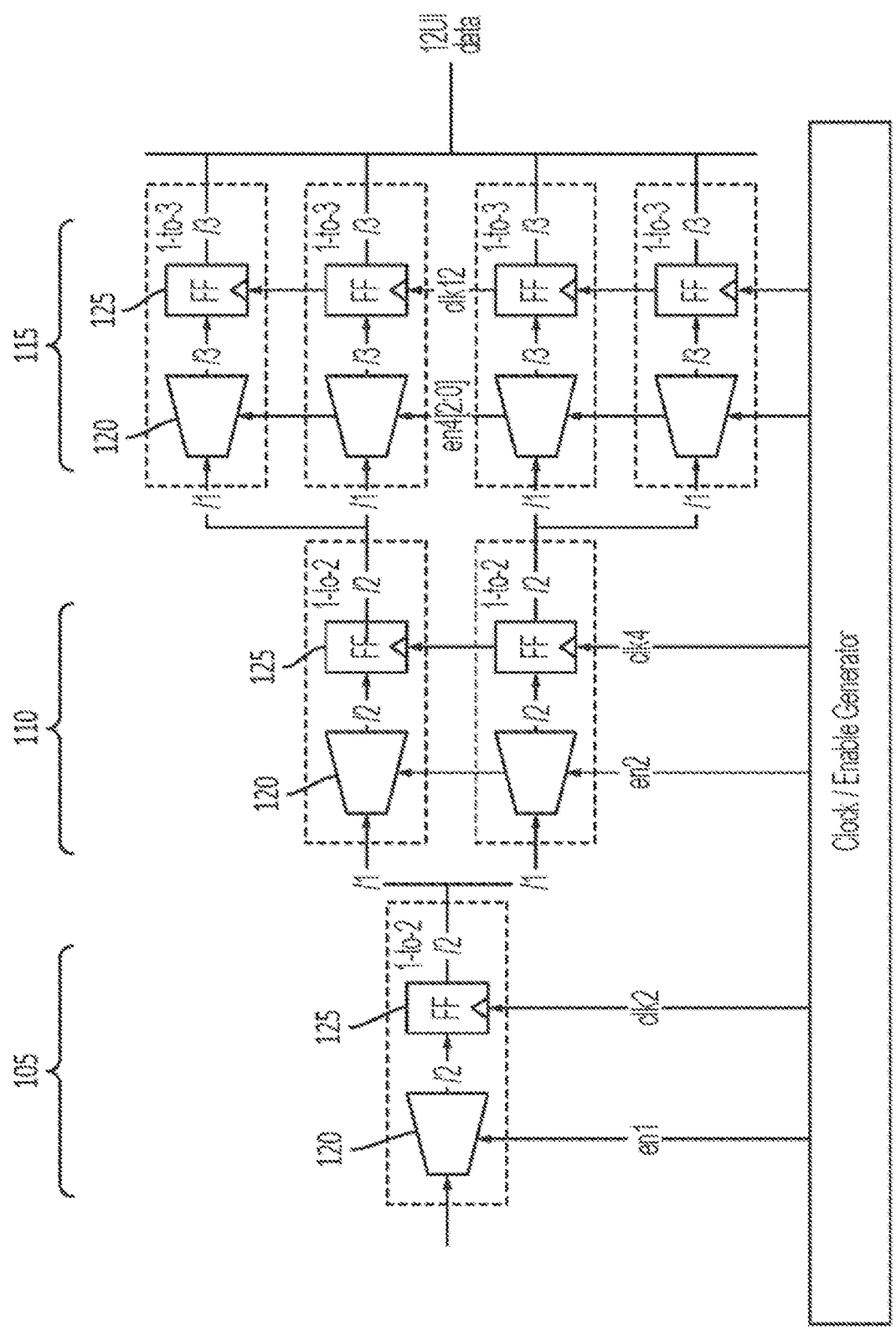
FIG. 1 is a schematic diagram of a deserializer circuit, according to an embodiment of the present disclosure.

Referring to FIG. 1, a deserializer circuit may include several stages, e.g., a first stage 105, a second stage 110, and a third stage 115. Each of the stages may include one or more demultiplexers 120 and a plurality of flip-flops 125. In FIG. 1, each box labeled "FF" represents an array of flip-flops, the number of flip-flops in each array being equal to the width of the busses at the input and output of the array of flip-flops. For example, in FIG. 1, the first stage 105 has a 1-to-2 demultiplexer connected by a 2-bit wide bus (as indicated by the label "/2") to an array of two flip flops. In some embodiments the deserializer circuit has between 2 and 8 stages.

Each demultiplexer 120 directs the signal at its input to one of its outputs, depending on the value of a control signal (or "enable signal") it receives. The flip-flops of the deserializer circuit latch the received signal at an edge of a clock signal; the clock signals of successive stages have decreasing frequencies, corresponding to each stage's producing wider parallel data at a lower update rate than the previous stage. The enable signal and the clock signals may be generated by a clock generator circuit described in further detail below.

At reset, the clock generator circuit may generate a combination of enable signals that result in the next serial bit received being directed to a first one of the outputs of the deserializer circuit (e.g., the top-most one of the 12 outputs of the deserializer circuit of FIG. 1); after the reset, each subsequent bit of the received serial data stream (or "bit stream") is directed to a different one of the outputs of the deserializer circuit, until each output has received one bit, at which point the next serial bit received is again directed to the first one of the outputs of the deserializer circuit.

As such, the output of the deserializer is a series of output data words (e.g., 12-bit wide data words, in the embodiment of FIG. 1), which may correspond to input data words fed into a serializer in a serial transmitter. Word alignment may be used to ensure that the output data words are the same as the input data words. If word alignment were not performed, or were performed incorrectly, a situation could arise in which instead each output data word corresponds to two fragments of successive input data words. In some embodiments the word length is between 6 bits and 128 bits.

Figure 2A:
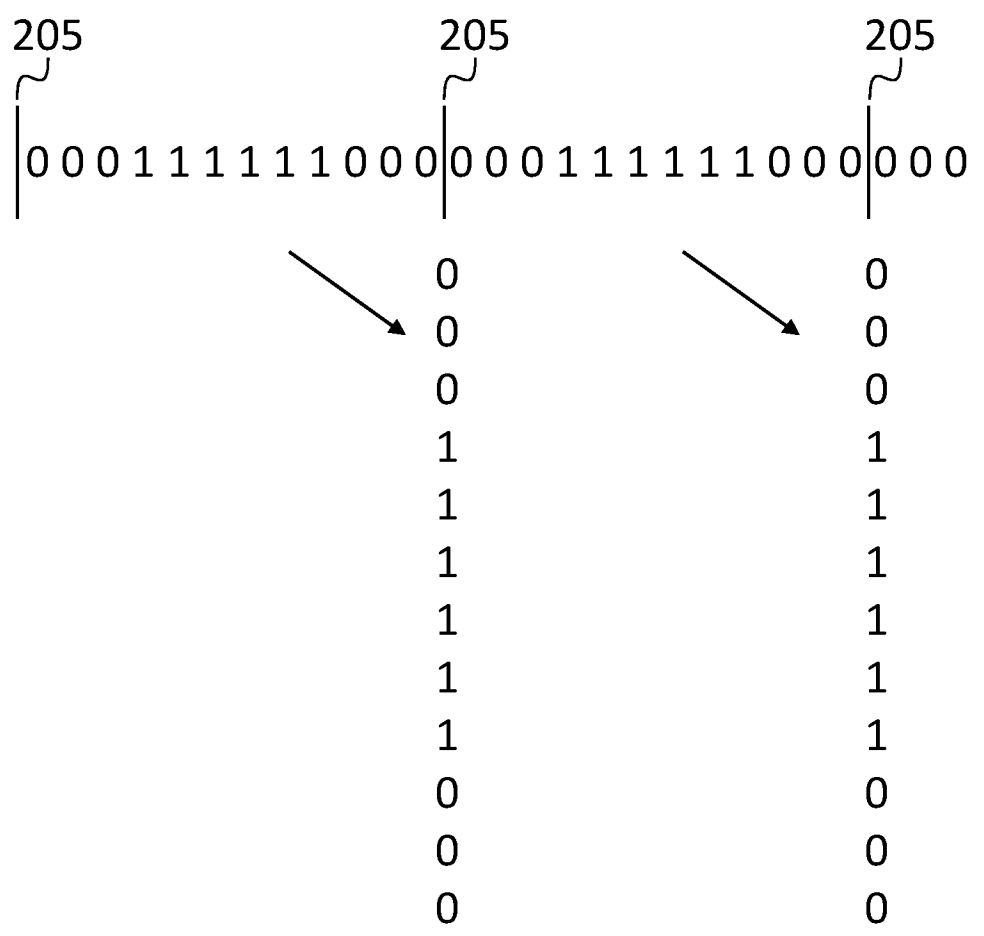
Figure 2B:
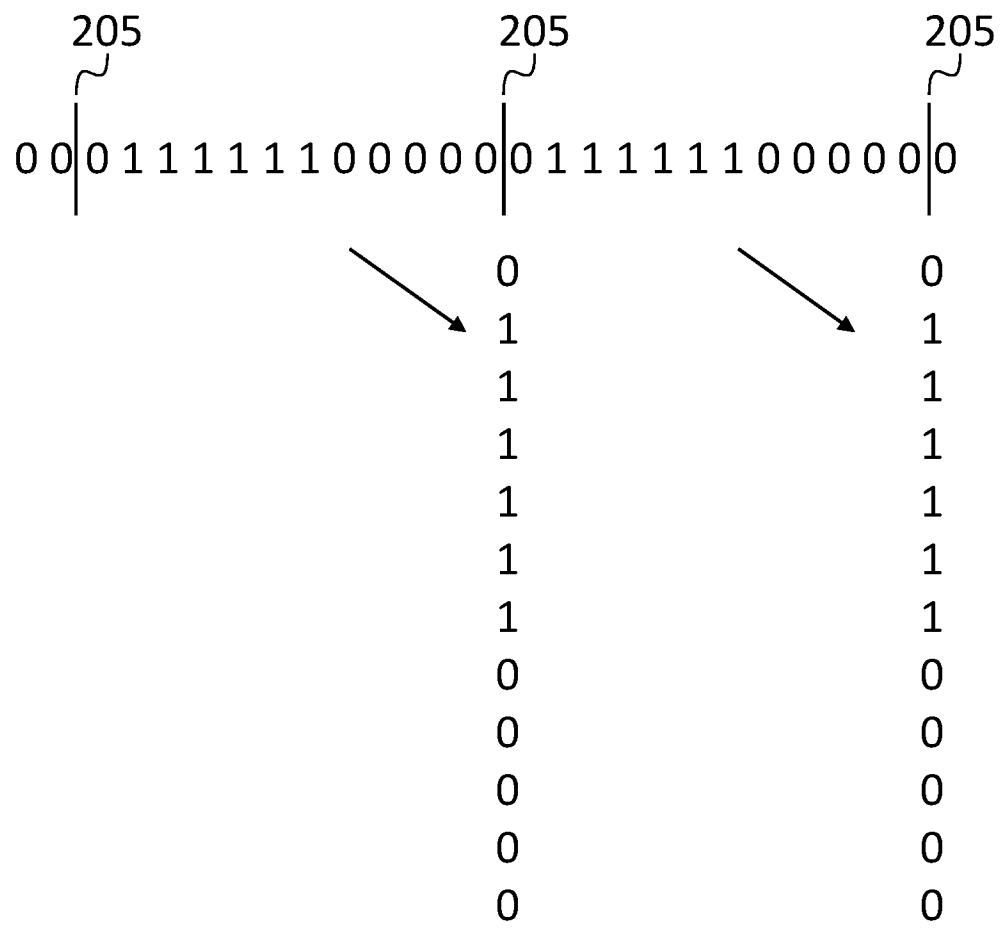

Word alignment may be performed by arranging for the transmitter to repeatedly transmit a data word consisting of a set bit pattern (e.g., "000111111000"); the receiver may then infer from the received bit stream where the word boundaries are. FIGS. 2A and 2B show how correct placement of the word boundaries in the receiver (FIG. 2A) may result in the output data words being the same as the input data words (i.e., the set bit pattern) and how incorrect placement of the word boundaries (FIG. 2B) may result in the output data words being different from the input data words. The set bit pattern may include a total of L zeros and M ones, with L about equal to M, and with the ones being substantially in the middle of the set bit pattern. In some embodiments, it may be sufficient for either L or M to be larger or equal to the number of bits in the decimated pattern (e.g., 4 bits, in the examples of FIG. 3 (discussed in further detail below)), and for zeros and ones to be consecutive, without necessarily being in the middle of the pattern. It will be understood that a complementary bit pattern may be used instead, to similar effect.

Figure 3:
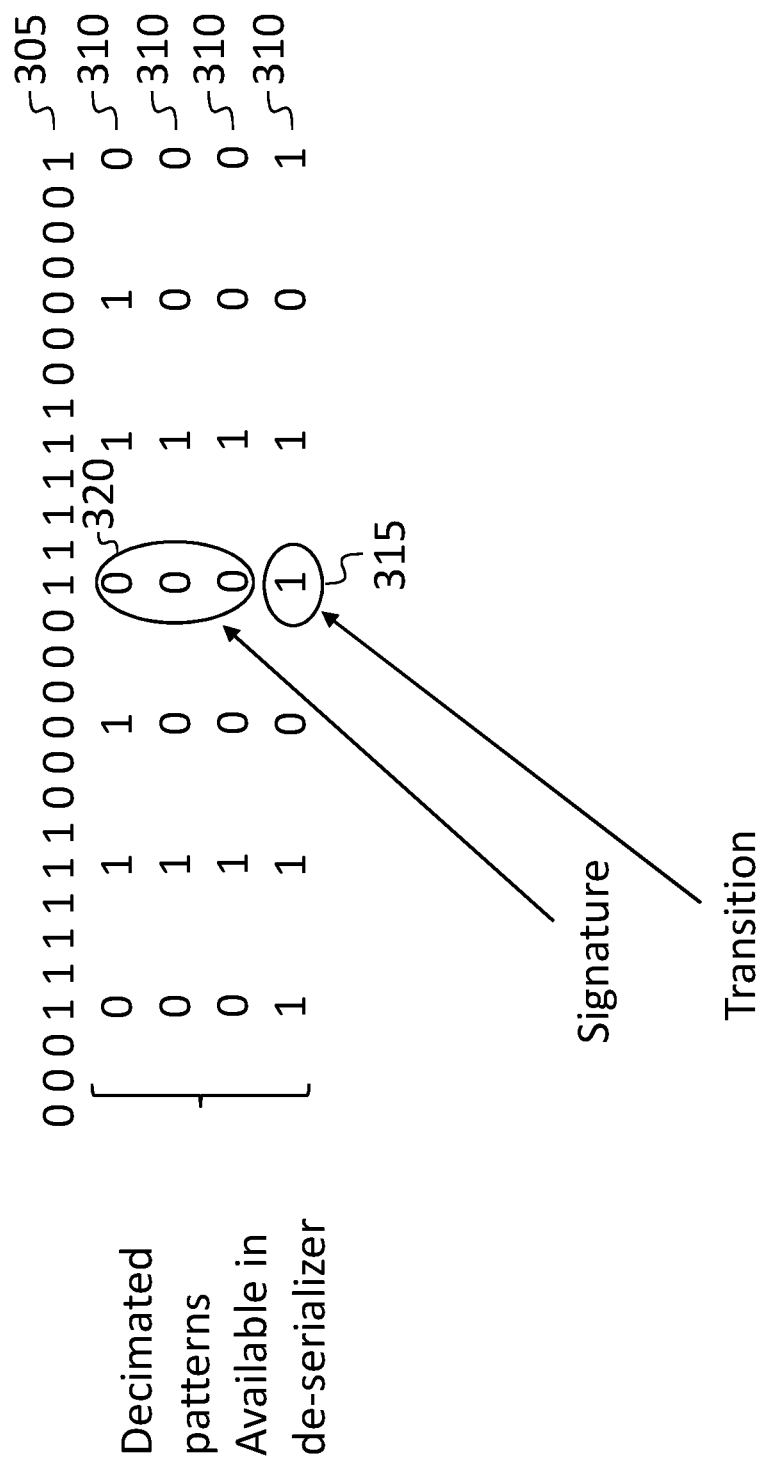
FIG. 3 is a data reordering diagram, according to an embodiment of the present disclosure.

FIG. 3 shows a received serial bit stream 305 and four decimated patterns 310 that may be produced, for example, by the four outputs of the second stage 110 of the deserializer circuit of FIG. 1. Time progresses from left to right in FIG. 3. In some embodiments, an alignment detection circuit (discussed in further detail below) detects coarse word alignment by testing for a change in value (e.g., a transition from zero to one) of one of the decimated patterns 310 (e.g., the fourth, or lowest, one of the four rows in FIG. 3). Such a change is labeled as a transition 315 in FIG. 3. At the time of the transition 315, the fourth decimated pattern has a value of one and its previous value (shown immediately to its left in FIG. 3) was zero. In some embodiments, the system for word alignment performs a reset of the clock generator circuit when coarse word alignment is detected. The values of the other three decimated patterns 310 form a "fine alignment code" 320 (or "signature") (e.g., a 3-bit word, in the embodiment of FIG. 3) that may be used to perform fine alignment, as discussed in further detail below.

Coarse word alignment may be detected for any of several possible word alignments of the received bit stream 305, as illustrated in FIG. 4. FIG. 4 shows, in a first column, the received serial bit stream 305 for the circumstances of FIG. 3, and, in the remaining three columns, the received serial bit streams 405, 410, 415 for three other bit alignments of the received serial bit stream, each of which would result in coarse word alignment detection at the same time. The fine alignment code differs for the four columns and may therefore be used to determine which of the four possible bit streams 305, 405, 410, 415 was present when coarse word alignment was detected.

When the clock generator circuit is reset (in response to the detecting of coarse word alignment), the raw output of the deserializer circuit may correspond to word boundaries that are incorrect by some number of bit positions (e.g., 1, 2, or 3 bit positions in the embodiment of FIG. 3). A fine alignment circuit may then be used to correct these alignment errors, based on the fine alignment code, as mentioned above and as discussed in further detail below.

Figure 5:
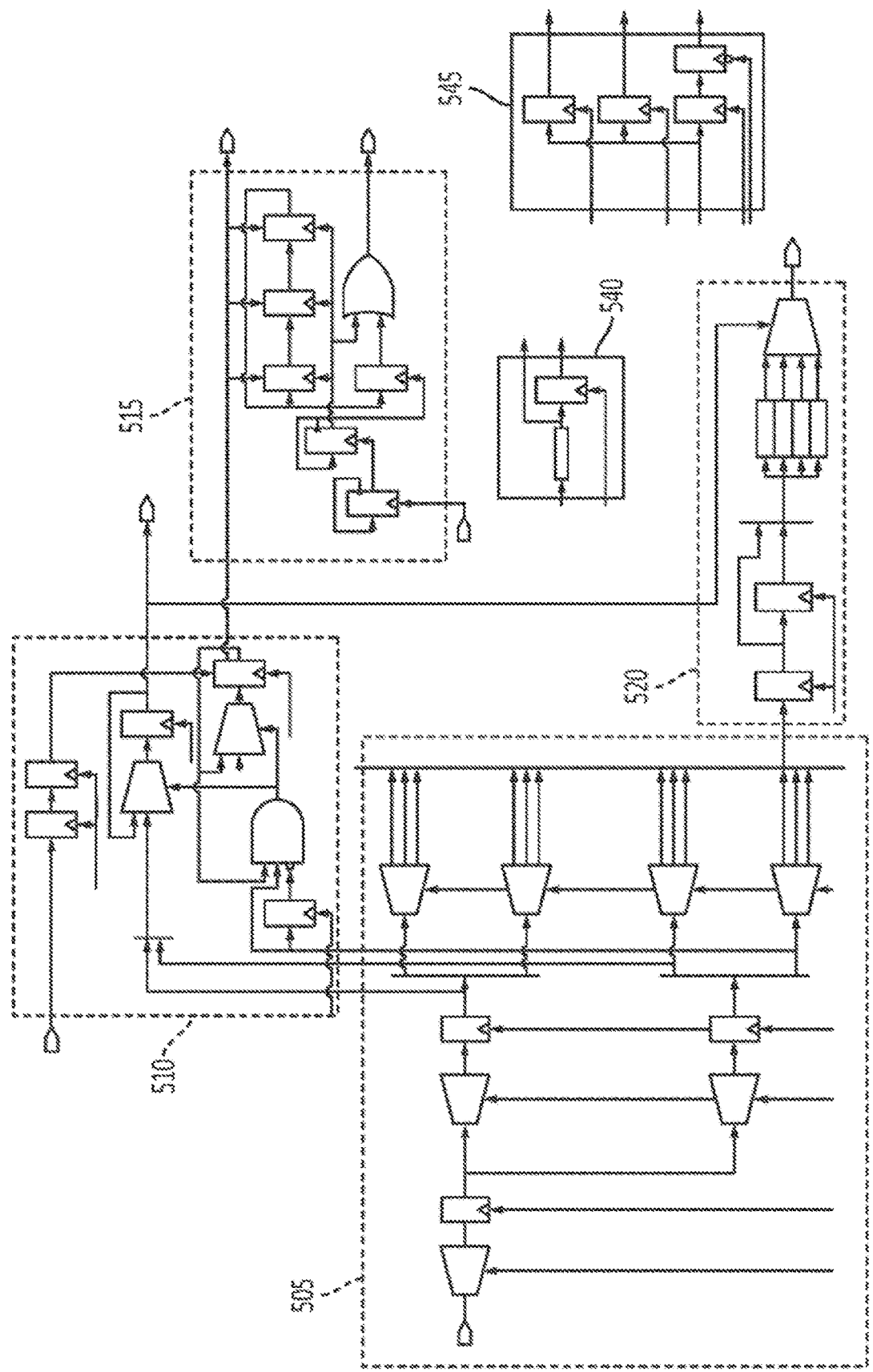
FIG. 5 is a schematic diagram of a circuit for word alignment and deserialization, according to an embodiment of the present disclosure.

Referring to FIG. 5, in some embodiments a circuit for word alignment and deserialization includes a deserializer circuit 505, an alignment detection circuit 510; a clock generator circuit 515, and a fine alignment circuit 520. FIG. 5 also shows the internal circuits of the 1-to-2 demultiplexers 540 and of the 1-to-3 demultiplexers 545 (each being an example of a demultiplexer 120 (FIG. 1)) of the deserializer circuit 505.

Figure 6A:
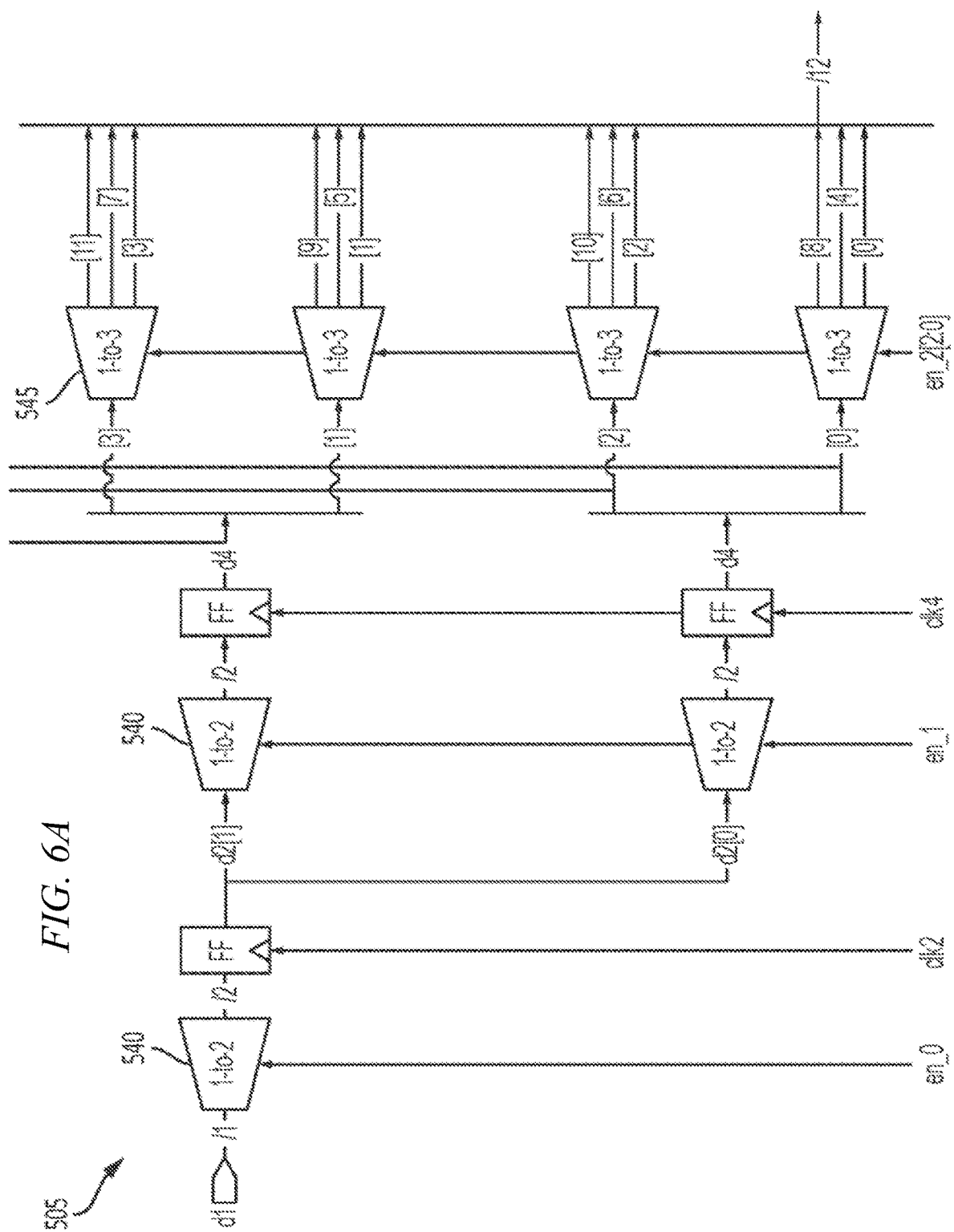
FIG. 6A is an enlarged view of a portion of the schematic diagram of FIG. 5, according to an embodiment of the present disclosure.

Referring to FIG. 6A, in some embodiments the deserializer circuit 505 includes three stages, like the deserializer circuit of FIG. 1, the first stage deserializing the data by a factor of two, the second stage deserializing the data by a further factor of two, and the third stage deserializing the data by a further factor of three. The outputs of the second stage are the decimated outputs discussed in the context of FIG. 3 above, and are fed to the alignment detection circuit 510. The raw fully deserialized output is fed to the fine alignment circuit 520.

Figure 6B:
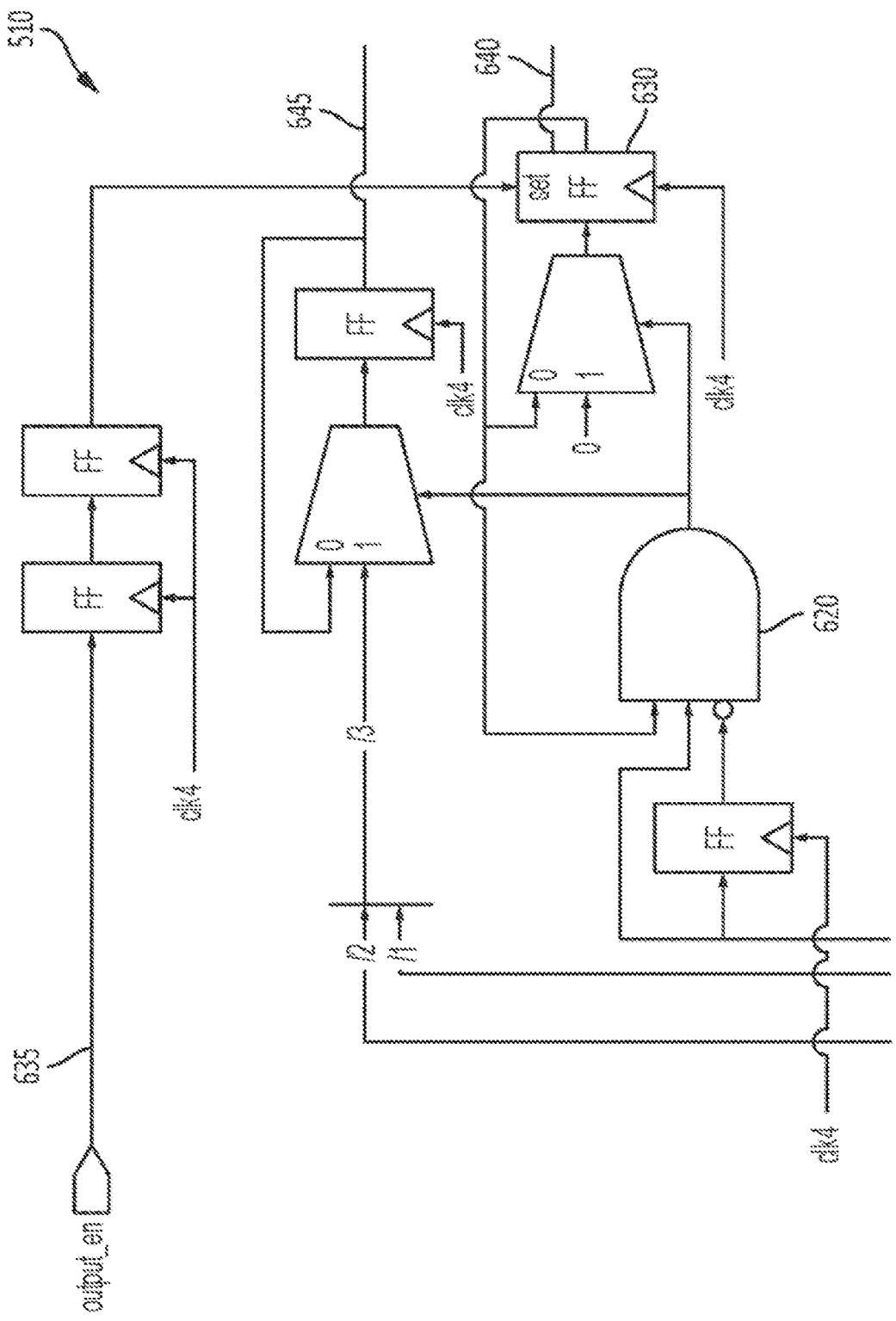
FIG. 6B is an enlarged view of a portion of the schematic diagram of FIG. 5, according to an embodiment of the present disclosure.

Referring to FIG. 6B, in some embodiments the alignment detection circuit 510 includes a three-input AND gate 620 with a flip-flop 625 for delaying the signal at one of the inputs, for detecting a zero-to-one transition in one of the decimated outputs (the one fed to the fourth (i.e., lowest) 1-to-3 demultiplexer of the 1-to-3 demultiplexers 545 of the third stage of the deserializer circuit 505). Two of the inputs of the three-input AND gate 620 are fed by this decimated output (one of the inputs of the three-input AND gate 620, the inverting input, being fed through the flip-flop 625). The remaining input of the three-input AND gate 620 is fed by the output of an output enable flip-flop 630 which is set at startup (under the control of the output enable signal 635 received by the alignment detection circuit 510). When the three-input AND gate 620 detects coarse word alignment, it resets the output enable flip-flop 630 (preventing further detections of coarse word alignment) and resets the clock generator circuit 515 by asserting the clock generator reset output 640. When the three-input AND gate 620 detects coarse word alignment, it also causes the data from the three other decimated outputs to be fed, through the fine alignment code output 645, to the fine alignment circuit 520, as the fine alignment code.

Figure 6C:
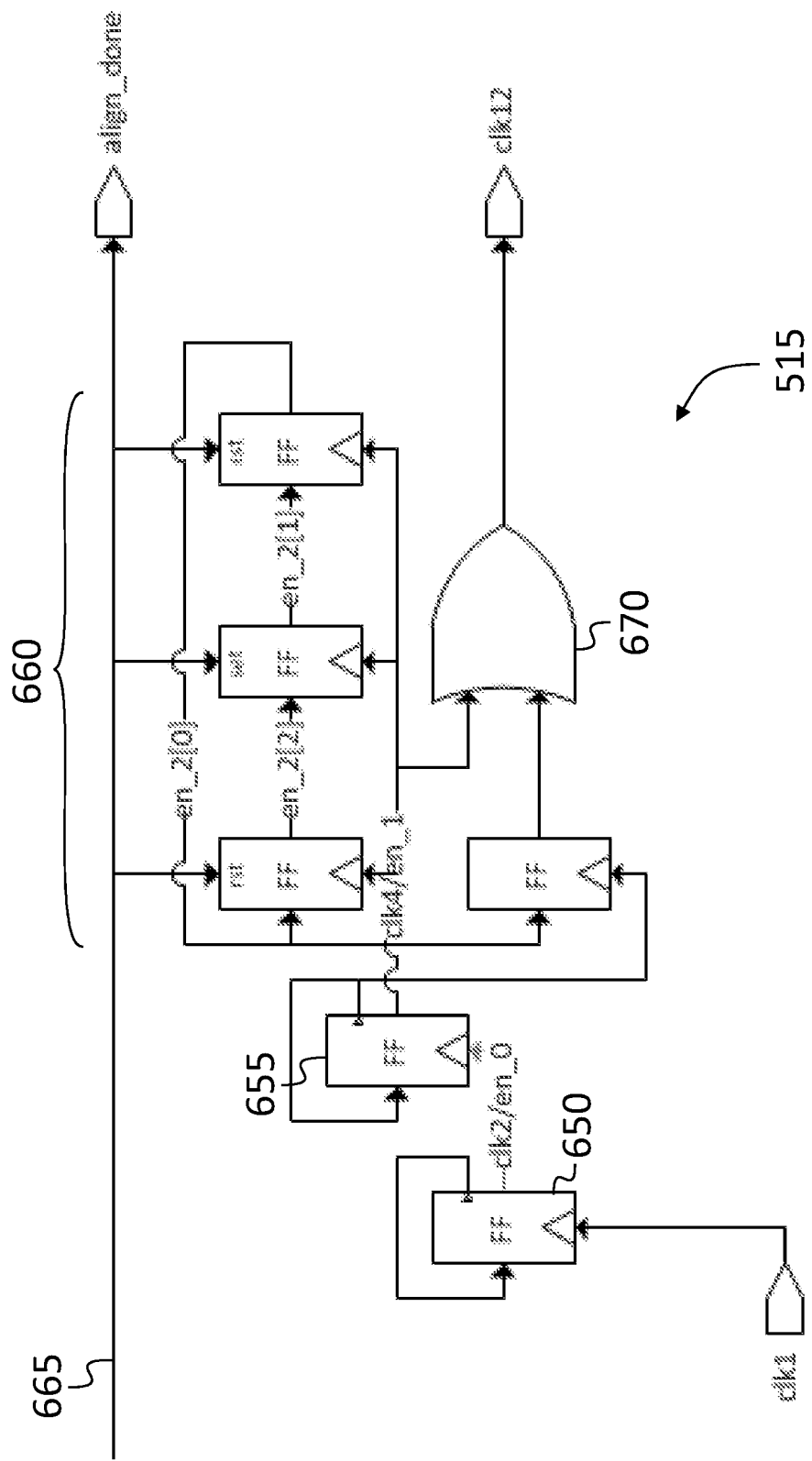
FIG. 6C is an enlarged view of a portion of the schematic diagram of FIG. 5, according to an embodiment of the present disclosure.

Referring to FIG. 6C, in some embodiments the clock generator circuit 515 includes a first divide-by-two counter 650 for generating a half-rate clock for the first stage of the deserializer circuit 505, a second divide-by-two counter 655 for generating a quarter-rate clock for the second stage of the deserializer circuit 505, and a three-bit ring counter 660 for generating a one-twelfth rate clock for the third stage of the deserializer circuit 505. The clock generator circuit 515 may be reset by a signal received (from the alignment detection circuit 510) at the reset input 665 of the clock generator circuit 515. The clock generator circuit 515 may include an OR gate configured to cause the duty cycle of the one-twelfth rate clock to be 50%. The use of a clock with a 50% duty cycle may improve timing margin; in some embodiments the duty cycle may be greater or less than 50%.

Figure 6D:
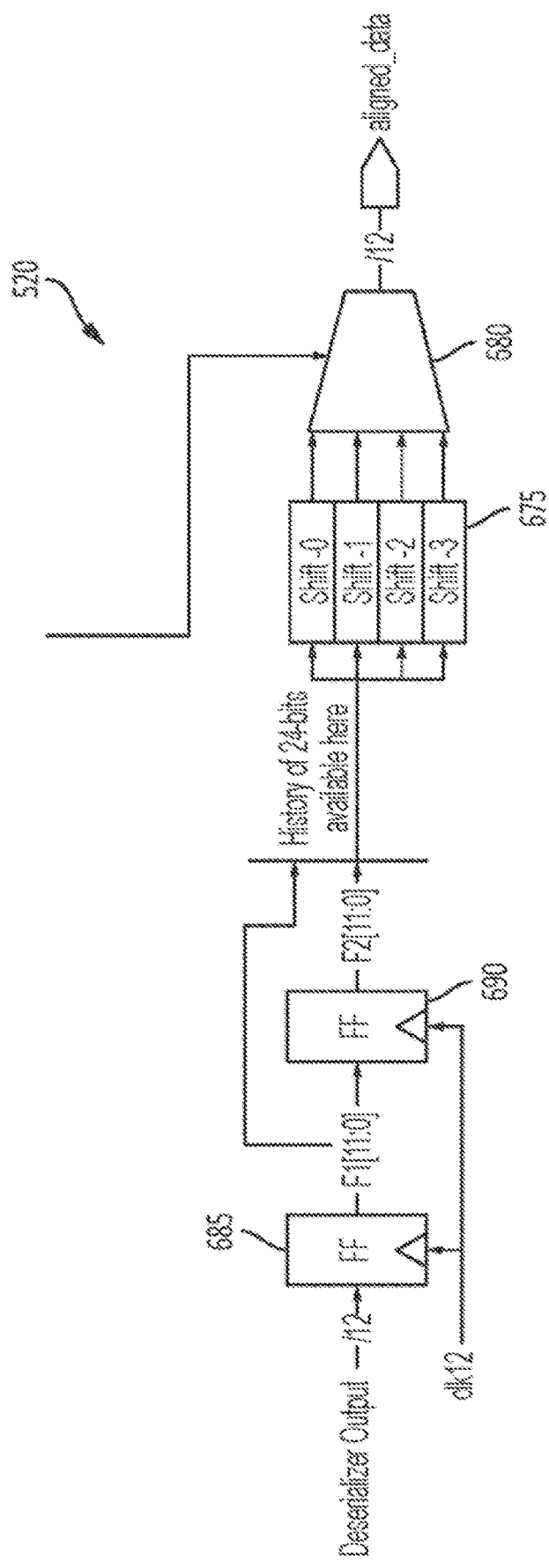
FIG. 6D is an enlarged view of a portion of the schematic diagram of FIG. 5, according to an embodiment of the present disclosure.

Referring to FIG. 6D, in some embodiments, the fine alignment circuit 520 includes a first bank of twelve flip-flops 685 and a second bank of twelve flip-flops 690, for storing the two most recently received raw data words from the deserializer circuit 505. The fine alignment circuit 520 further includes four shift blocks 675, and a multiplexer 680 for selecting from among the four shift blocks 675 based on the fine alignment code received from the alignment detection circuit 510. The first one of the four shift blocks 675 (labeled "Shift-0") may correspond to a fine alignment code indicating that no fine alignment adjustment is necessary; it may contain wires connecting the outputs of the flip-flops of the first bank of flip-flops 685 to the (12-wide) output of the first one of the four shift blocks 675 (which is connected to a first 12-wide input (of the four such inputs) of the multiplexer 680). The second one of the four shift blocks 675 (labeled "Shift-1") may correspond to a fine alignment error of one bit position; it may contain wires connecting (i) the outputs of eleven of the flip-flops of the first bank of flip-flops 685 and (ii) the output of one of the flip-flops of the second bank of flip-flops 690, to the (12-wide) output of the second one of the four shift blocks 675. The "Shift-2" and "Shift-3" shift blocks 675 may similarly each contain wires for feeding, to a respective 12-wide input (of the four such inputs) of the multiplexer 680, a different combination of outputs from the first bank of flip-flops 685 and outputs from the second bank of flip-flops 690.

In the embodiment of FIGS. 5 and 6A-6D, the decimation ratio (which is greater than the size of the fine alignment code by one) is four. It will be understood that this ratio may be selected to be greater or smaller, by extracting the decimated outputs after a different stage of the deserializer circuit 505 or by changing the deserialization ratio of one or more of the stages, or both. A smaller value of the decimation ratio may result in a smaller signature size, and, accordingly, a smaller fine alignment circuit 520. However, a smaller value of the decimation ratio may result in the transition detection circuits operating at higher speed, making timing requirements more difficult to meet.

In some embodiments, a circuit for word alignment and deserialization may be a processing circuit, different from that of FIGS. 5 and 6A-6D, configured to perform the methods described herein. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept. The word "last", however has, as used herein, its customary meaning and refers to a thing that is at an end of a sequence of similar things.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for word alignment using deserializer pattern detection have been specifically described and illustrated herein, many modifications and variations will be apparent to those skilled in the art. Accordingly, it is to be understood that a system and method for word alignment using deserializer pattern detection constructed according to principles of this disclosure may be embodied other than as specifically described herein. The invention is also defined in the following claims, and equivalents thereof.

What is claimed is:

1. A system for word alignment, the system comprising:
    a deserializer circuit;
    an alignment detection circuit; and
    a clock generator circuit,
    the clock generator circuit having:
        a plurality of enable outputs connected to a plurality of enable inputs of the deserializer circuit, and
        a plurality of clock outputs connected to a plurality of clock inputs of the deserializer circuit;
    the alignment detection circuit being configured:
        to detect a coarse word alignment; and
        in response to detecting the coarse word alignment, to cause a reset of the clock generator circuit.

2. The system of claim 1, wherein the deserializer circuit comprises a plurality of stages, each stage comprising:
    one or more demultiplexers, and
    a plurality of flip-flops, each having a data input connected to a respective output of one of the one or more demultiplexers.

3. The system of claim 2, wherein:
    a data output of a first flip-flop of a first stage of the plurality of stages is connected to an input of the alignment detection circuit;
    the alignment detection circuit is configured to detect the coarse word alignment from a change in value at the data output of the first flip-flop; and
    the first stage is not the last stage of the deserializer circuit.

4. The system of claim 1, wherein the alignment detection circuit is further configured, in response to detecting the coarse word alignment, to capture a fine alignment code.

5. The system of claim 1, further comprising a fine alignment circuit configured to adjust word alignment in increments of one bit position.

6. The system of claim 5, wherein the fine alignment circuit comprises:
    a plurality of shift blocks having delays differing by one bit position; and
    a demultiplexer configured to select a data stream from one of the shift blocks.

7. The system of claim 6, wherein:
    the alignment detection circuit is further configured, in response to detecting the coarse word alignment, to capture a fine alignment code; and
    the demultiplexer of the fine alignment circuit is configured to select a data stream from one of the shift blocks based on the fine alignment code.

8. The system of claim 5, wherein:
    the deserializer circuit comprises a plurality of stages, each stage comprising:
        one or more demultiplexers, and
        a plurality of flip-flops, each having a data input connected to a respective output of one of the one or more demultiplexers;

a data output of a first flip-flop of a first stage of the plurality of stages is connected to an input of the alignment detection circuit;

the alignment detection circuit is configured to detect the coarse word alignment from a change in value at the data output of the first flip-flop; and the first stage is not the last stage of the deserializer circuit.

9. The system of claim 8, wherein the alignment detection circuit is further configured, in response to detecting the coarse word alignment, to capture a fine alignment code.

10. The system of claim 9, wherein the fine alignment code comprises output signals from all of the flip-flops of the first stage except the first flip-flop.

11. A method for word alignment in a system comprising:
a deserializer circuit, and
a clock generator circuit to provide at least a clock signal to the deserializer circuit,
the method comprising:
deserializing a received data stream, by the deserializer circuit;
detecting a coarse word alignment in the received data stream; and
in response to detecting the coarse word alignment, resetting the clock generator circuit.

12. The method of claim 11, wherein the deserializer circuit comprises a plurality of stages, each stage comprising:
one or more demultiplexers, and
a plurality of flip-flops, each having a data input connected to a respective output of one of the one or more demultiplexers.

13. The method of claim 12, wherein:
the detecting of the coarse word alignment comprises detecting a change in value at a data output of a first flip-flop of a first stage of the plurality of stages; and
the first stage is not the last stage of the deserializer circuit.

14. The method of claim 11, further comprising, in response to detecting the coarse word alignment, capturing a fine alignment code.

15. The method of claim 11, further comprising adjusting word alignment by one bit position.

16. The method of claim 15, wherein the system further comprises a plurality of shift blocks having delays differing by one bit position.

17. The method of claim 16, further comprising:
in response to detecting the coarse word alignment, capturing a fine alignment code; and
selecting a data stream from one of the shift blocks based on the fine alignment code.

18. The method of claim 17, wherein:
the deserializer circuit comprises a plurality of stages, each stage comprising:
one or more demultiplexers, and
a plurality of flip-flops, each having a data input connected to a respective output of one of the one or more demultiplexers;
the detecting of the coarse word alignment comprises detecting a change in value at a data output of a first flip-flop of a first stage of the plurality of stages; and
the first stage is not the last stage of the deserializer circuit.

19. The method of claim 18, wherein the fine alignment code comprises output signals from all of the flip-flops of the first stage except the first flip-flop.

20. A system for word alignment, the system comprising:
a deserializer circuit;
a clock generator circuit to provide at least a clock signal to the deserializer circuit; and
means for:
detecting a coarse word alignment; and
in response to detecting the coarse word alignment, resetting the clock generator circuit.

* * * * *